United States Patent
Chieh

(10) Patent No.: US 7,369,189 B2
(45) Date of Patent: May 6, 2008

(54) FRAME FOR LIQUID CRYSTAL DISPLAY DEVICE PROVIDED WITH PROTRUDENT ELEMENTS AND BLOCKING ELEMENTS BEING ENGAGED WITH MOUNTING OPENINGS AND INDENTATIONS

(75) Inventor: Cho Tsung Chieh, Taipei (TW)

(73) Assignee: Arima Display Corporation, Kaohsiung (TW)

( * ) Notice: Subject to any disclaimer, the term of this patent is extended or adjusted under 35 U.S.C. 154(b) by 545 days.

(21) Appl. No.: 10/825,462

(22) Filed: Apr. 15, 2004

(65) Prior Publication Data

US 2005/0231658 A1    Oct. 20, 2005

(51) Int. Cl.
G02F 1/1333    (2006.01)
(52) U.S. Cl. ...................................... 349/58
(58) Field of Classification Search ............... 349/58, 349/60
See application file for complete search history.

(56) References Cited

U.S. PATENT DOCUMENTS 5,815,224 A * 9/1998 Hasegawa et al. ............ 349/58
5,889,623 A * 3/1999 Ueda et al. .................. 359/819
6,002,582 A * 12/1999 Yeager et al. ................ 361/681
6,919,941 B2 * 7/2005 Huang et al. ................. 349/58
2002/0191126 A1 * 12/2002 Sasuga et al. ................ 349/58
2003/0043314 A1 * 3/2003 Lee et al. .................... 349/65
2003/0234894 A1 * 12/2003 Lee ............................. 349/58

* cited by examiner

Primary Examiner—Andrew Cohecter
Assistant Examiner—Lauren Nguyen
(74) Attorney, Agent, or Firm—The Webb Law Firm

(57) ABSTRACT

A liquid crystal display module is provided. The LCD module includes a liquid crystal display body, a base having a first frame, a cover having a second frame for covering the base, a plurality of mounting openings mounted on an outer wall of the second frame, a plurality of indentations positioned at a bottom surface of the second frame, a plurality of protrudent elements mounted on an outer wall of the first frame for being engaged with the plurality of mounting openings so as to secure the engagement between the first frame and the second frame, and a plurality of blocking elements mounted at a bottom surface of the first frame for preventing the bottom surface of the second frame from being pressed over the bottom surface of the first frame.

11 Claims, 7 Drawing Sheets

FRAME FOR LIQUID CRYSTAL DISPLAY DEVICE PROVIDED WITH PROTRUDENT ELEMENTS AND BLOCKING ELEMENTS BEING ENGAGED WITH MOUNTING OPENINGS AND INDENTATIONS

FIELD OF THE INVENTION

The present invention is related to a liquid crystal display, and more particularly, to a liquid crystal display module.

BACKGROUND OF THE INVENTION

While the technology is getting developed and the demanding is getting increased, the conventional cathode ray tube (CRT) monitor cannot satisfy people's needs anymore owning to the disadvantages of big size, heavy weight, and high power consumption. Especially in the application for the portable, small-sized, and low power-consumption computer, people expect a new type of monitor with small size, light weight, and low power consumption. Under this trend, the liquid crystal display (LCD) is developed. Since the liquid crystal display has numerous advantages, such as the thin and small size, low power consumption, no radiation, flat displaying, and stable images, it has gradually displaced the CRT and become the main stream in the market, especially after the price for the LCD is getting lower in recent years.

Presently, the LCD can be divided into four types according to the driving method for the liquid crystal. They are twisted nematic (TN), super twisted nematic (STN), double layer super twisted nematic (DSTN), and thin film transistor (TFT). Nevertheless, no matter which type is employed, the structure of an LCD module is basically similar. Generally, the thickness of an LCD panel is less than 1 cm for being thin, light and small. The LCD panel is composed of more than 20 materials and elements. Depending on the LCD type, the needed materials could be very different. The structure of an LCD module is like a sandwich that an LCD display, a liquid crystal assembly, and a backlight module are mounted between the upper cover and the lower base. The liquid crystal assembly usually includes a glass substrate, a color filter, a polarizing filter, an alignment layer, and etc. A liquid crystal display body is accomplished by filling the liquid crystal space (smaller than $5 \times 10^{-6}$ m) with the liquid crystal.

In order to stabilize the whole LCD structure, the liquid crystal display body is usually assembled between an upper cover and a lower base. Please refer to FIG. 1. FIG. 1 is a diagram showing the assembling of an LCD module according to the prior art. The LCD module 10 mainly includes the base 11, the cover 12, and the liquid crystal display body 15. The liquid crystal display body 15 has the essential components including a backlight module, a liquid crystal assembly, a printed circuit board, and a display panel (not shown) so as to perform a display function. The structure of the liquid crystal display body 15 might be altered based on different LCD products and needed functions, i.e. STN-LCD and TFT-LCD have different liquid crystal display bodies. Traditionally, there are plural fixing openings 18 mounted on the base frame 13 of the base 11. On the cover frame 14 of the cover 12, there are plural fixing pieces 17 mounted on the positions corresponding to those of the fixing openings 18. In the beginning of the assembling process, the cover 12 is placed facing upwards. Then the liquid crystal display body 15 having its front side facing downwards is placed on the cover 12. One side of the base 11 is connected with the corresponding side of the cover 12 before the cover 12 covers the liquid crystal display body 15. Consequently, the base frame 13 and the cover frame 14 are connected to each other. Ultimately, the plural fixing pieces 17 are turned into the corresponding plural fixing openings 18 by the clamping tool specific for assembling the LCD module in order to make the plural fixing pieces 17 grappled and engaged with the corresponding plural fixing openings 18. Therefore, the cover frame 14 is fixedly engaged with the base frame 13 by the plural fixing pieces 17. Accordingly, the assembling of the LCD module 10 is achieved.

Please refer to FIG. 2. FIG. 2 is a diagram showing the outside appearance of the assembled LCD module according to the prior art. Other than accomplished by hand, the process that the plural fixing pieces 17 are turned into the corresponding plural fixing openings 18 by the clamping tool could be accomplished by the particular clamping module (not shown) specific for assembling the LCD module as well. The clamping module provides a force simultaneously pushing and turning the plural fixing pieces 17 so as to complete the assembling process rapidly. Through the clamping module, the production on large scale is attainable.

However, there are several disadvantages existing in the above assembly process. First, in order to maintain the liquid crystal display intact and avoid the liquid crystal display body 15 from damage, the assembling process is proceeded reversely. That is, the whole LCD module 10 is reversed and facing downwards during the assembling process. After the assembling is accomplished, the LCD module 10 is reversed and facing upwards again. In other words, the LCD module 10 has to be moved to another worktable in the production line, which is very inconvenient and costs too much time and manpower. On the other hand, when using the clamping module for mass production, different clamping modules with different sizes must be made according to the sizes of different LCD module 10, which is uneconomic and increases the production costs. Besides, the bending area 175 of the fixing piece 17 is easy to be broken owing to the repeated bending and the excessive applying force, which will seriously affect the structure of the LCD module 10. Furthermore, in the process that the fixing piece 17 is turned into the corresponding fixing opening 18 by the clamping tool, not only the turning angle of the fixing piece 17 is altered every time, but also the depth engaged with the fixing opening 18 of the fixing piece 17 is mostly different every time. Therefore, even though it seems the structure of the LCD module 10 is stabilized by the engagement between the plural fixing piece 17 and the corresponding plural fixing openings 18, the stability of the LCD module 10, in fact, is affected and altered by the engagement stability between the plural fixing piece 17 and the corresponding plural fixing openings 18. In the field of LCD module, in which the structural stability is extremely critical, the quality control for the structural stability of LCD module would be seriously affected.

From the above description, it is known that how to develop an LCD module with a higher structural stability and a simpler assembling process for LCD module so as to lower the production cost and save the assembling time have become a major problem waited to be solved. In order to overcome the drawbacks in the prior art, a liquid crystal display module is provided in the invention. The particular design not only solves the inconvenience of the reverse assembling for LCD module, but also simplifies the assembly process without the need for the extra clamping module. Therefore, the needs for lowering the production cost and increasing the structural stability of the LCD module are both achieved. Thus, the invention has the utility for the industry.

SUMMARY OF THE INVENTION

The main purpose of the present invention is to provide a liquid crystal display module, which faces upwards during the assembling process. That is, the LCD module is at an obverse position for the whole assembling time without the needs of being reversed during assembling. In addition, the assembling can be accomplished without the clamping tool or the clamping module. The assembling is achieved by pressing the cover downwards, which can be implemented conveniently and fast.

It is another object of the present invention to provide a particular structure of a liquid crystal display module. Through the plural protrudent elements mounted on the frame of the base and the plural opening mounted on the frame of the cover, in which the protrudent elements passes though the openings, the base and the cover are engaged and secured. In addition, there are plural blocking elements mounted at a bottom edge of the base frame for preventing the bottom surface of the cover frame from being pressed over the bottom edge of the base frame. As such, the accidental damage to the liquid crystal display body can be avoided. Besides, the plural protrudent elements and the plural blocking elements are mounted at different horizontal positions. The relative horizontal positions therebetween particularly render the base and the cover engaged at a particular position so that the structure of the LCD module has a higher stability.

According to one aspect of the present invention, a liquid crystal display module includes: a liquid crystal display body; a base having a first frame; a cover having a second frame for covering the base through an engagement between the first frame and the second frame; a plurality of mounting openings mounted on an outer wall of the second frame; a plurality of indentations positioned at a bottom surface of the second frame; a plurality of protrudent elements mounted on an outer wall of the first frame and having positions corresponding to those of the plurality of mounting openings for being engaged with the plurality of mounting openings so as to secure the engagement between the first frame and the second frame; and a plurality of blocking elements mounted at a bottom surface of the first frame and having positions corresponding to those of the plurality of indentations for preventing the bottom surface of the second frame from being pressed over the bottom surface of the first frame.

In accordance with the present invention, the liquid crystal display body is mounted inside a space constructed by the base and cover.

Preferably, the upper surfaces of the plurality of protrudent elements are slant flats so as to help the plurality of protrudent elements to protrude through the plurality of mounting openings when the first frame is engaged with the second frame.

Preferably, the bottom surfaces of the plurality of protrudent elements are flat surfaces so as to prevent the first frame from being disengaged from the second frame.

Preferably, the plurality of mounting openings has sizes larger than those of the plurality of protrudent elements so as to help the engagement between the first frame and the second frame.

Preferably, the plurality of protrudent elements, the blocking elements, the plurality of mounting openings, and the plurality of indentations are mounted on an outer wall of the liquid crystal display module.

Preferably, the first frame, the plurality of protrudent elements, and the plurality of blocking elements are formed integrally.

Preferably, the plurality of protrudent elements and the plurality of blocking elements are positioned on the first frame alternately.

Preferably, the plurality of protrudent elements have horizontal positions higher than those of the blocking elements.

Preferably, the bottom surfaces of the plurality of protrudent elements have same horizontal positions as upper surfaces of the blocking elements.

Preferably, the liquid crystal display body includes a backlight module, a liquid crystal assembly, a printed circuit board, and a display panel so as to perform a display function.

Preferably, the liquid crystal display body is selected from one group consisting of a twisted nematic (TN), a super twisted nematic (STN), a double layer super twisted nematic (DSTN), and a thin film transistor (TFT).

According to another aspect of the present invention, a liquid crystal display module includes a liquid crystal display body; a base having a first frame; a cover having a second frame for covering the base through an engagement between the first frame and the second frame; a plurality of mounting openings mounted on an outer wall of the second frame; and a plurality of protrudent elements mounted on an outer wall of the first frame and having positions corresponding to those of the plurality of mounting openings for being engaged with the plurality of mounting openings so as to secure the engagement between the first frame and the second frame.

The foregoing and other features and advantages of the present invention will be more clearly understood through the following descriptions with reference to the drawings, wherein:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 1:
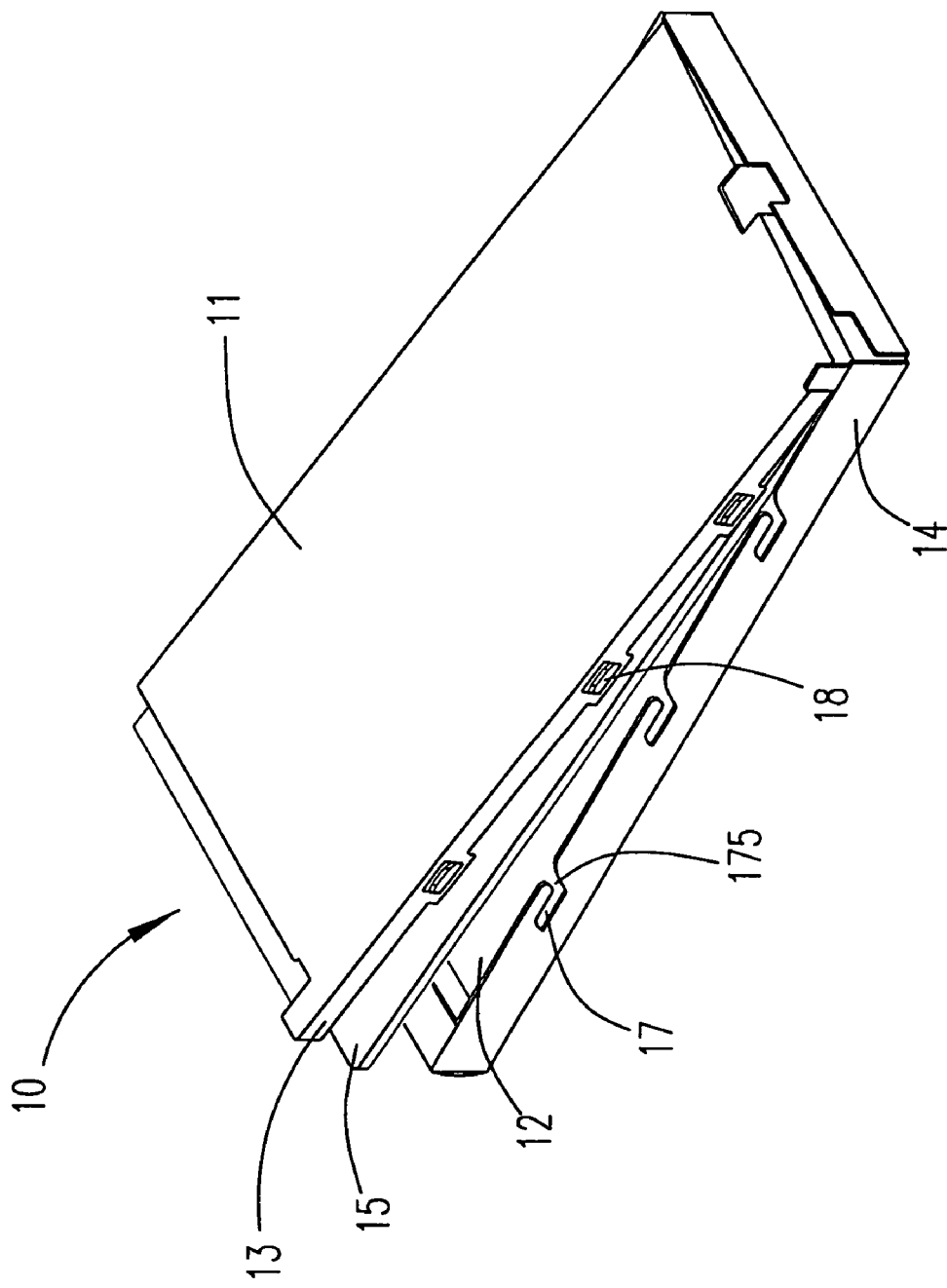
FIG. 1 is a diagram showing the assembling of an LCD module according to the prior art.
Figure 2:
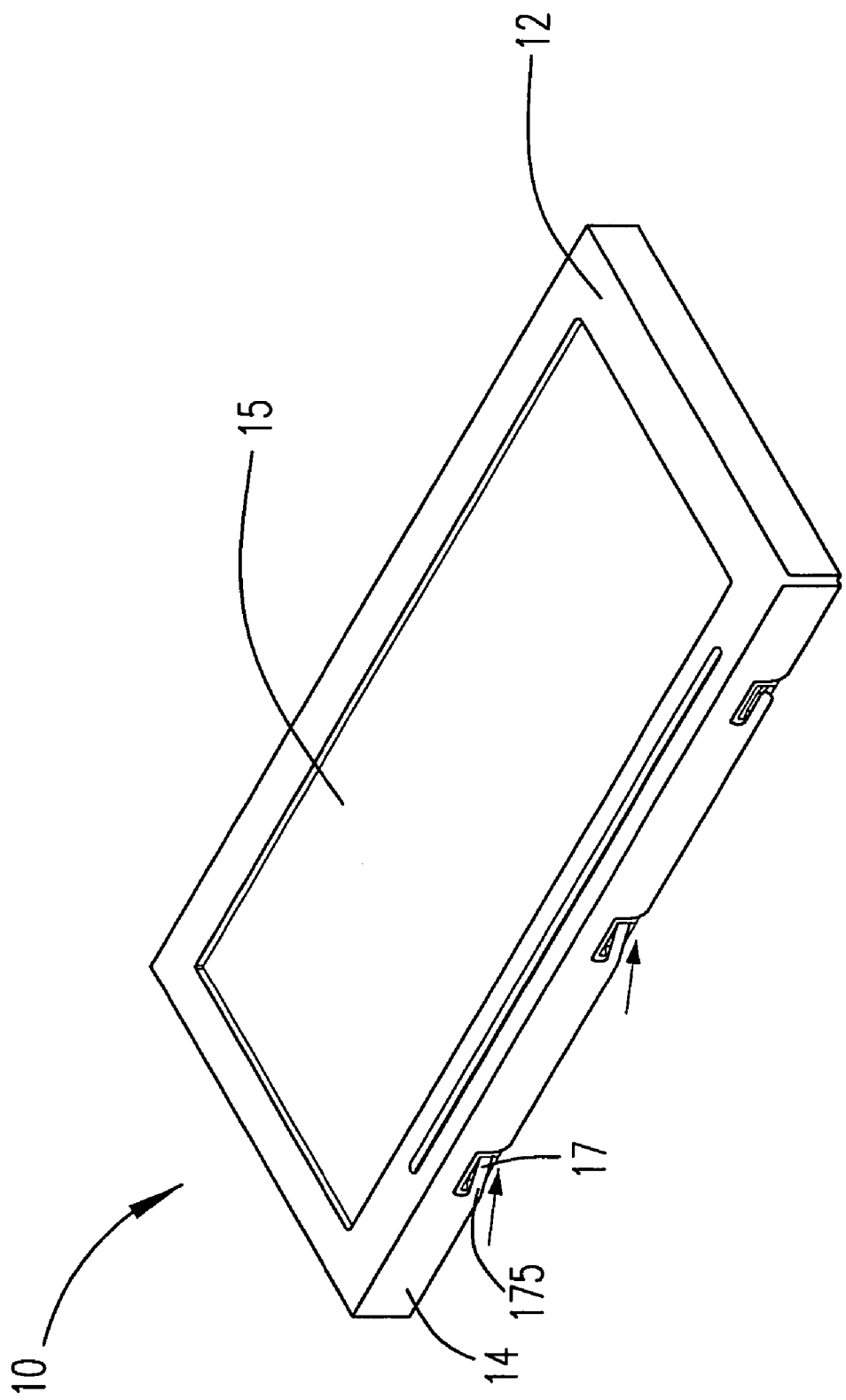
FIG. 2 is a diagram showing the outside appearance of the assembled LCD module according to the prior art.
Figure 3:
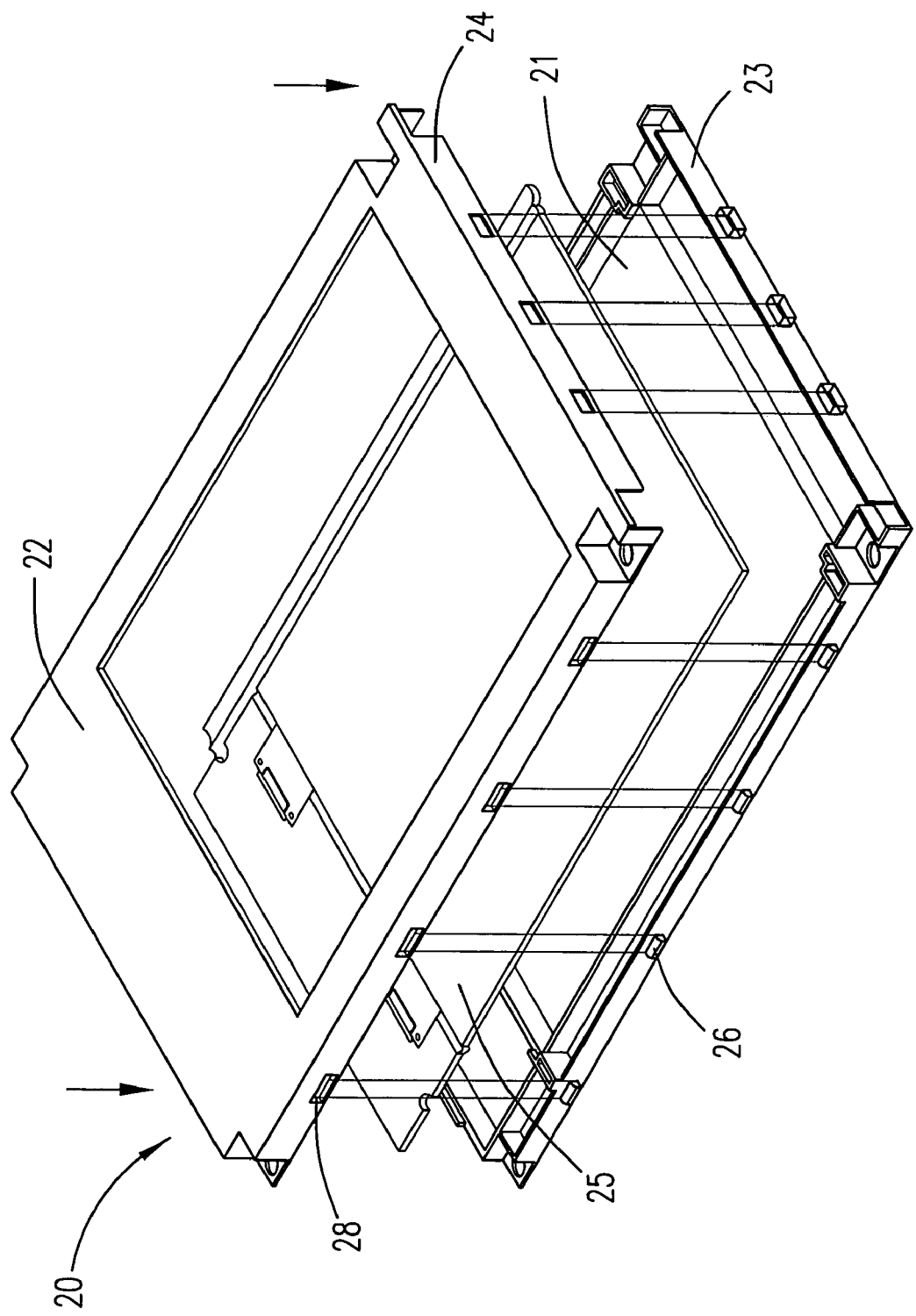
FIG. 3 is a diagram illustrating the structure of the liquid crystal display module before the assembling according to a preferred embodiment of the present invention.

Please refer to FIG. 3. FIG. 3 is a diagram illustrating the structure of the liquid crystal display module before the assembling according to a preferred embodiment of the present invention. The LCD module 20 mainly includes the base 21, the cover 22, the liquid crystal display body 25, the plural mounting openings 28, and the plural protrudent elements 26. The base 21 has the first frame 23 for placing the liquid crystal display body 25 therein. That is, the liquid crystal display body 25 is mounted inside a space constructed by the base 21 and the cover 22. The cover 22 includes the second frame 24 for covering the base 21 through an engagement between the first frame and the second frame. Besides, the plural mounting openings 28 are mounted on the outer wall of the second frame 24. The plural mounting openings 28 has sizes larger than those of the plural protrudent elements 26 so as to help the engagement between the first frame 23 and the second frame 24. The plural protrudent elements 26 are mounted on the outer wall of the first frame 23 and have the positions corresponding to those of the plural mounting openings 28 for being engaged with the plural mounting openings so as to secure the engagement between the first frame 23 and the second frame 24. Accordingly, the LCD module 20 is at an obverse position for the whole assembling time without the needs of being reversed during the assembling. In addition, the assembling can be accomplished without the clamping tool or the clamping module. The assembling is achieved by directly pressing the cover 22 downwards, which can be implemented conveniently and fast.

Figure 4:
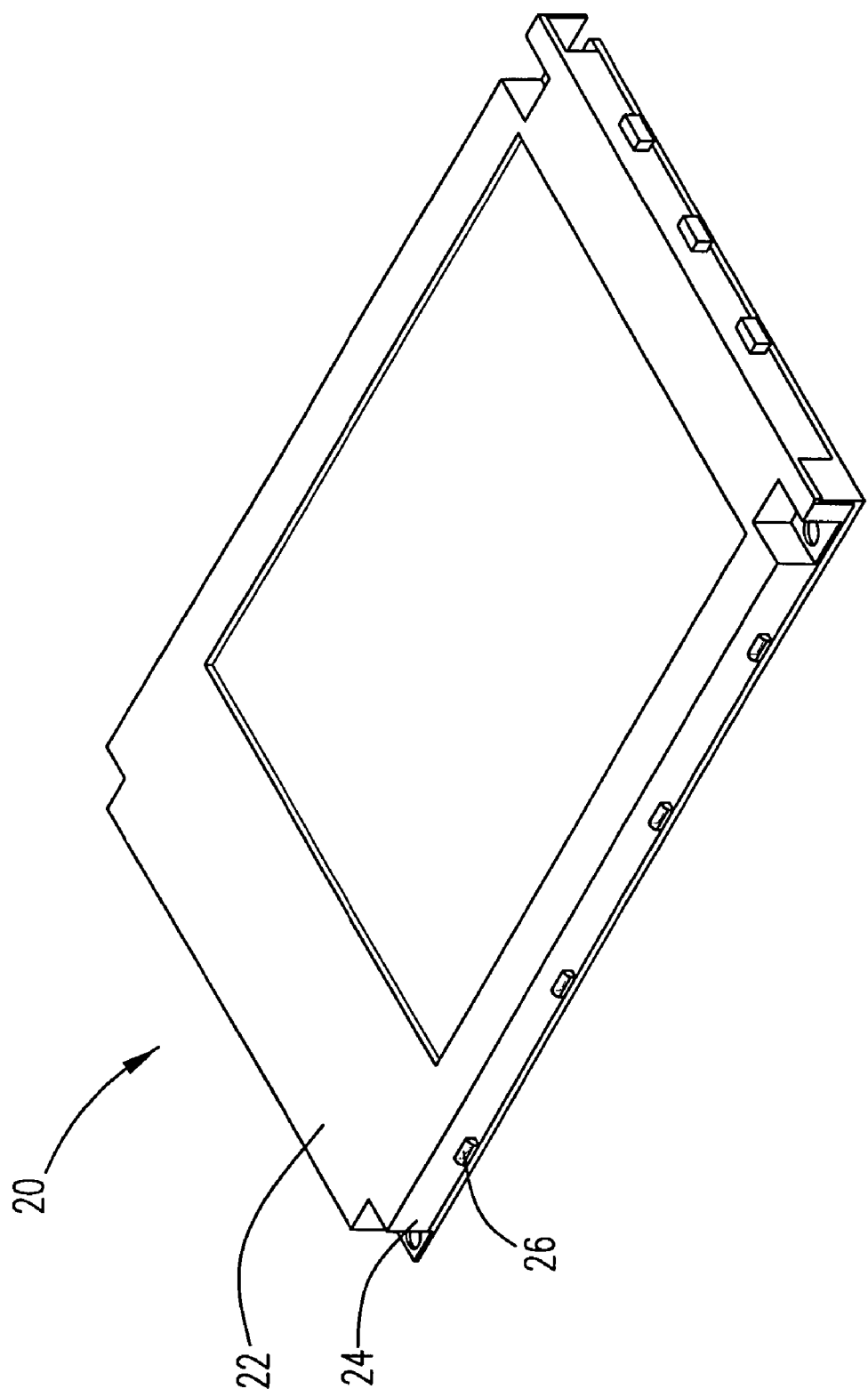
FIG. 4 is a diagram illustrating the outside appearance of the liquid crystal display module after the assembling according to a preferred embodiment of the present invention.

Please refer to FIG. 4. FIG. 4 is a diagram illustrating the outside appearance of the liquid crystal display module after the assembling according to a preferred embodiment of the present invention. Apparently, the plural protrudent elements 26 and the plural mounting openings 28 are mounted on the outer wall of the liquid crystal display module 20. In addition, according to another embodiment of the present invention, the mounted positions of the plural protrudent elements 26 and the plural mounting openings 28 can be exchanged. In other words, the plural protrudent elements 26 are mounted on the second frame 24, while the plural mounting openings 28 are mounted on the first frame 23. During the assembling process, similarly, the plural protrudent elements 26 pass through the first frame 23 via the plural mounting openings 28 for fixedly securing the engagement between the first frame 23 and the second frame 24.

Figure 5:
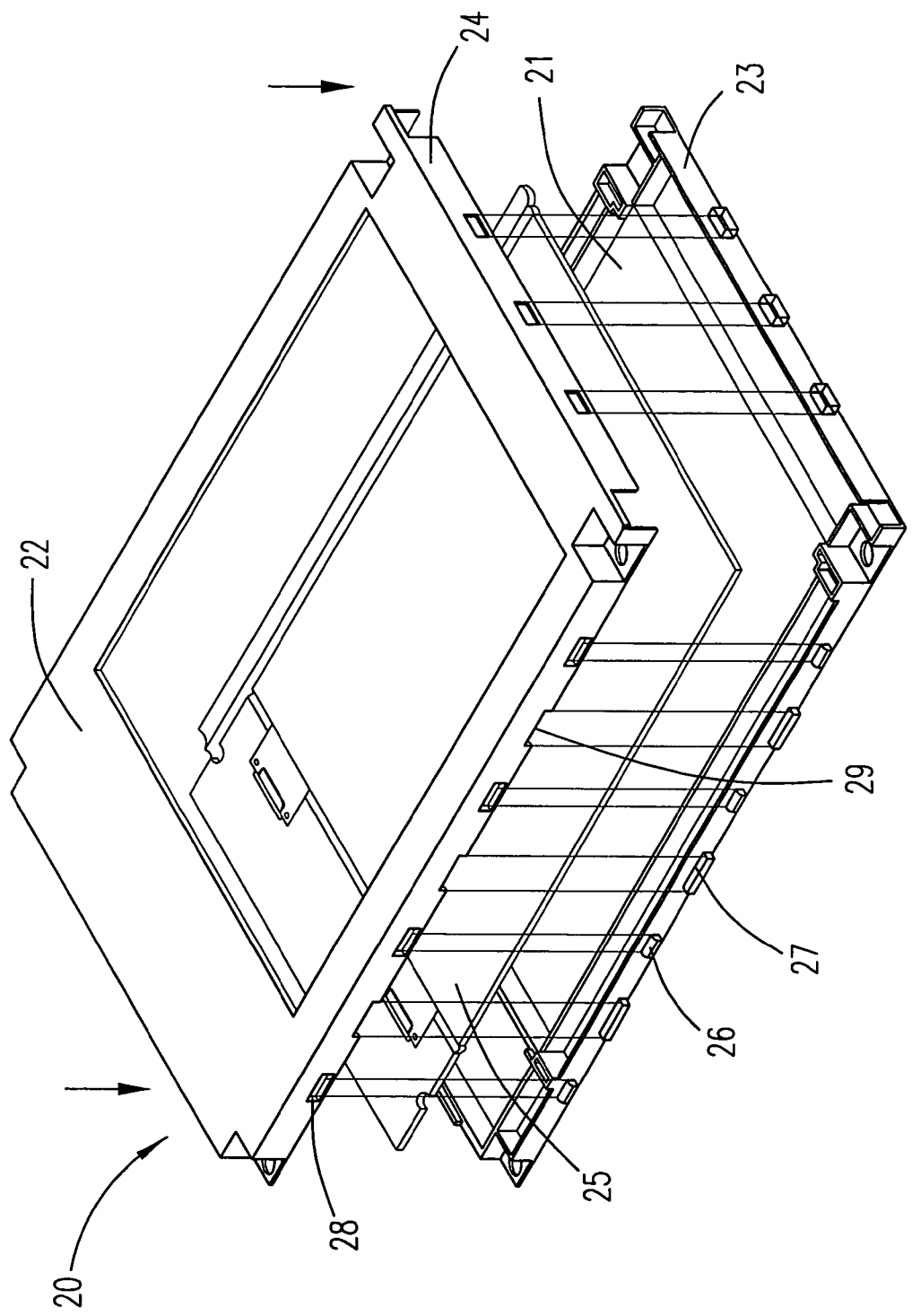
FIG. 5 is a diagram illustrating the structure of the liquid crystal display module before the assembling according to another preferred embodiment of the present invention.

Please refer to FIG. 5. FIG. 5 is a diagram illustrating the structure of the liquid crystal display module before the assembling according to another preferred embodiment of the present invention. According to another embodiment of the present invention, the LCD module 20 mainly includes the base 21, the cover 22, and the liquid crystal display body 25. The cover 22 includes the second frame 24 for covering the base 21 through an engagement between the first frame and the second frame. Besides, the plural mounting openings 28 are mounted on the outer wall of the second frame 24. And there are plural indentations 29 positioned at a bottom surface of the second frame 24. The plural protrudent elements 26 are mounted on the outer wall of the first frame 23 and have the positions corresponding to those of the plural mounting openings 28 for being engaged with the plural mounting openings so as to secure the engagement between the first frame 23 and the second frame 24. Except the above structures, there are plural blocking elements 27 mounted at a bottom surface of the first frame 23. The plural blocking elements 27 are mounted at the positions corresponding to those of the plural indentations 29 in order to prevent the bottom surface of the second frame 24 from being pressed over the bottom surface of the first frame 23 and the liquid crystal display body 25 will not be damaged accordingly.

According to a embodiment of the present invention, the structure of the liquid crystal display body 25 is altered based on different LCD products and the functions thereof. Basically, the liquid crystal display body 25 includes a backlight module, a liquid crystal assembly, a printed circuit board (PCB), and a display panel (not shown) so as to perform a display function. The working principles are the same as the conventional ones and therefore they are not repeatedly described here. Preferably, the liquid crystal display body 25 is selected from one group consisting of a twisted nematic (TN), a super twisted nematic (STN), a double layer super twisted nematic (DSTN), and a thin film transistor (TFT).

Figure 6:
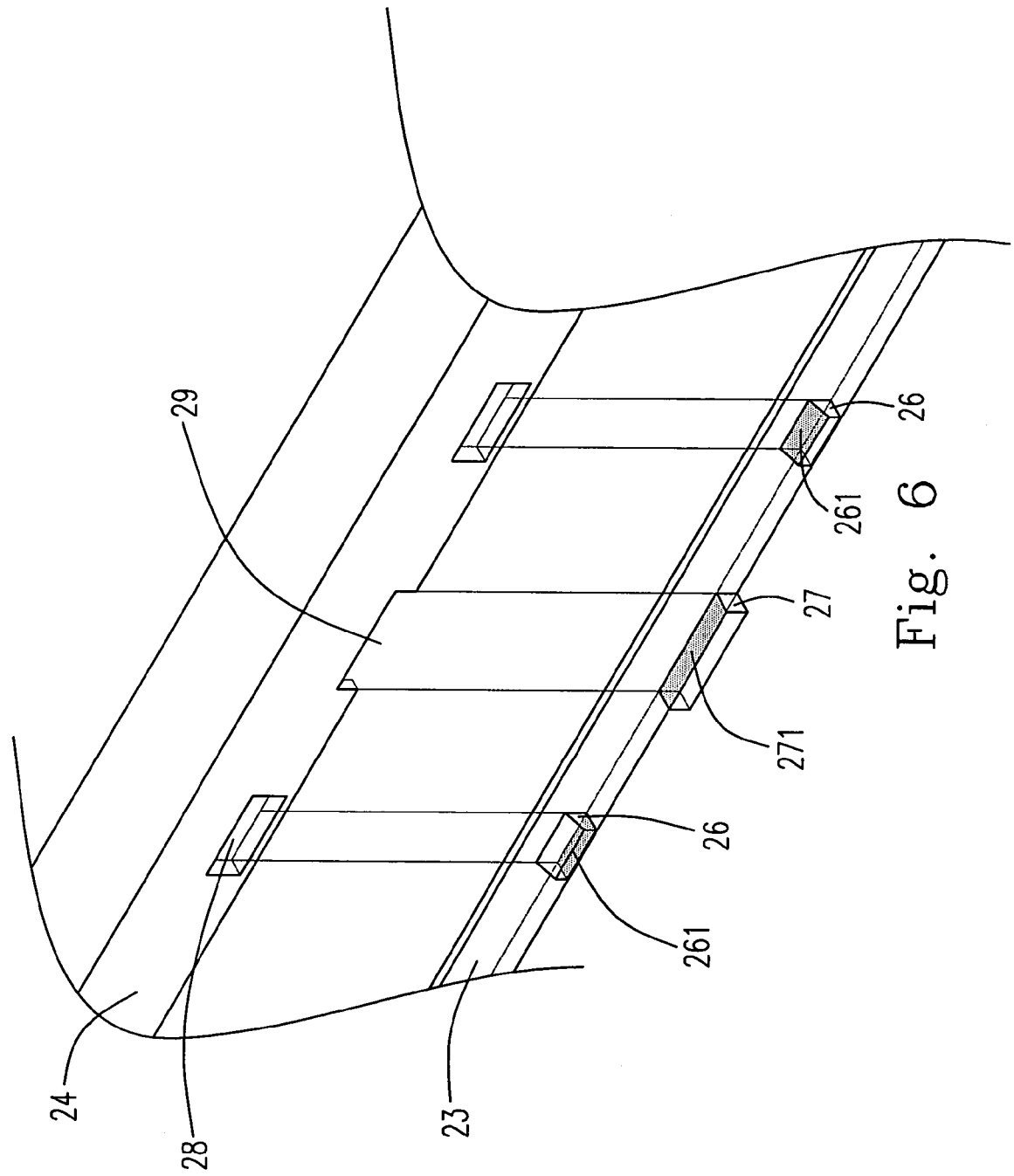
FIG. 6 is a diagram showing the enlarged view of partial structure of the liquid crystal display module according to a preferred embodiment of the present invention.

The characteristic of the present invention is that the LCD module 20 is at an obverse position for the whole assembling time. The LCD module 20 needs not to be reversed during the assembling. Instead, the assembling can be accomplished without the clamping tool or the clamping module. By directly pressing the cover 22 downwards, the cover 22 can be secured at a fixed position and engaged with the base 11. In order to achieve this purpose, the structure of the LCD module 20 provided in the present invention includes the mounting openings 28, the indentation 29, the protrudent element 26, and the blocking element 27 whose mounted positions are designed particularly and specifically. Please refer to FIG. 6. FIG. 6 is a diagram showing the enlarged view of partial structure of the liquid crystal display module according to a preferred embodiment of the present invention. When the first frame 23 and the second frame 24 are engaged with each other, the plural protrudent elements 26 and the plural blocking elements 27 are mounted at different horizontal positions. As such, the relative horizontal positions therebetween would particularly render the base and the cover engaged at a particular position so that the second frame 24 will not be pressed over the first frame 23 and the liquid crystal display body 25 will not be damaged accordingly. In which, the plural protrudent elements 26 have horizontal positions higher than those of the plural blocking elements 27. Further, the upper surfaces of the plural protrudent elements 26 are slant flats 262 so as to help the plural protrudent elements 26 to protrude through the plural mounting openings 28 when the first frame 23 is engaged with the second frame 24. In addition, the bottom surfaces of the plural protrudent elements 26 are flat surfaces 261. After the plural protrudent elements 26 protrude through the second frame 24, the flat surfaces 261 are being against the mounting openings 28 so as to prevent the first frame 23 from being disengaged from the second frame 24. According to a preferred embodiment of the present invention, the plural protrudent elements 26 are mounted at the horizontal positions of the first frame 23, where is higher than the positions of the plural blocking elements 27. More specifically, the bottom surfaces of the plural protrudent elements 26 have same horizontal positions as the upper surfaces 271 of the blocking elements 27. In such a way, when the cover 22 is pressed downwards by an external force, the plural protrudent elements 26 protrude through the second frame 24 and the flat surfaces 261 are being against the mounting openings 28. Meanwhile, the upper surfaces 271 of the blocking elements 27 are being against the indentations 29 so as to prevent the cover 22 from being pressed excessively. Accordingly, the second frame 24 is secured at a fixed position and the assembling is achieved.

Figure 7:
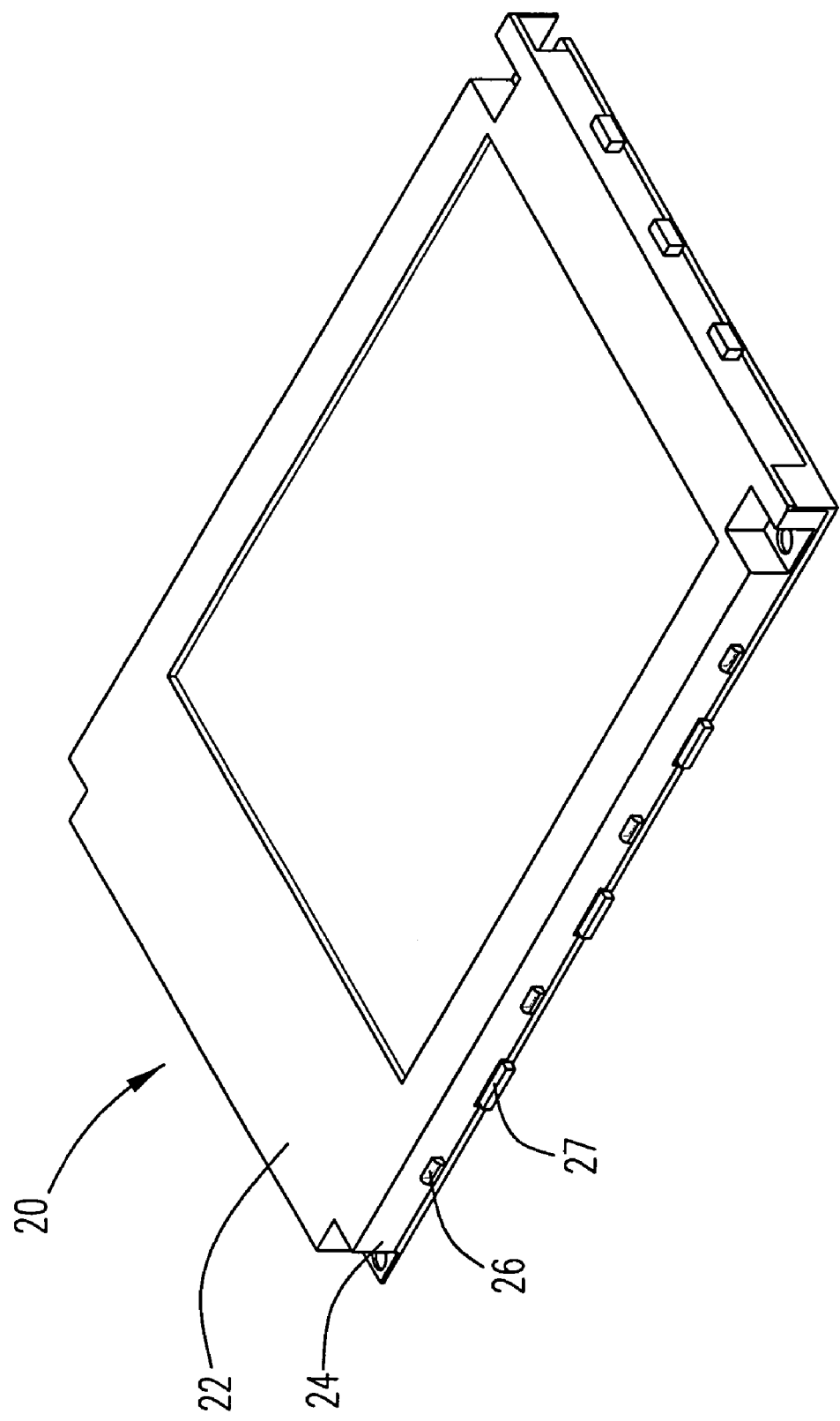
FIG. 7 is a diagram illustrating the outside appearance of the liquid crystal display module after the assembling according to another preferred embodiment of the present invention.

Please refer to FIG. 7. Apparently, the plural protrudent elements 26, the blocking elements 27, the plural mounting openings 28, and the plural indentations 29 are mounted on the outer wall of the liquid crystal display module 20. In addition, in order to enhance the structural stability of the LCD module 20, the plural protrudent elements 26 and the plural blocking elements 27 are positioned on the first frame 23 alternately. Moreover, the first frame 23, the plural protrudent elements 26 and the plural blocking elements 27 are formed integrally. Additionally, according to a preferred embodiment of the present invention, the mounted positions of the plural protrudent elements 26 and the plural mounting openings 28 can be exchanged. In other words, the plural protrudent elements 26 are mounted on the second frame 24, while the plural mounting openings 28 are mounted on the first frame 23. During the assembling process, the plural protrudent elements 26 pass through the first frame 23 via the plural mounting openings 28 for fixedly securing the engagement between the first frame 23 and the second frame 24. Similarly, mounted positions of the blocking elements 27 and the indentations 29 can be exchanged. In other words, the indentations 29 are mounted on the first frame 23, while the blocking elements 27 are mounted on the second frame 24. During the assembling process, the blocking elements 27 are being against the indentations 29 so as to prevent the second frame 24 from being pressed excessively and the liquid crystal display body 25 will not be damaged accordingly.

According to the above, the drawbacks in the conventional extending base are not existed in the liquid crystal display module provided in the present invention. First, the LCD module is at an obverse position for the whole assembling time. The LCD module needs not to be reversed during the assembling. Besides, the LCD module needs not to be moved to another worktable in the production line anymore and the assembling can be accomplished on a single worktable. Furthermore, the assembling of the LCD module provided in the present invention can be accomplished without any clamping tool or clamping module. By directly pressing the cover 22 downwards, the cover 22 can be secured at a fixed position and engaged with the base 11. Not only the assembling is implemented conveniently and fast, but also the costs for the clamping tool or the clamping module are saved. In addition, through the mounted positions of the composition elements including the protrudent element 26, the blocking element 27, the mounting opening 28, and the indentation 29, the engagement between the base frame and the cover frame is more rigid and solider. Accordingly, the LCD module provided in the present invention has a higher structural stability. Hence, the present invention not only has a novelty and a progressive nature, but also has an industry utility.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A liquid crystal display module, comprising:
    a liquid crystal display body;
    a base having a first frame;
    a cover having a second frame for covering said base through an engagement between said first frame and said second frame;
    a plurality of mounting openings mounted on an outer wall of said second frame;
    a plurality of indentations positioned at a bottom surface of said second frame;
    a plurality of protrudent elements mounted on an outer wall of said first frame and having positions corresponding to those of said plurality of mounting openings for being engaged with said plurality of mounting openings so as to secure said engagement between said first frame and said second frame; and
    a plurality of blocking elements mounted at a bottom surface of said first frame and having positions corresponding to those of said plurality of indentations for preventing said bottom surface of said second frame from being pressed over said bottom surface of said first frame, wherein said bottom surfaces of said plurality of protrudent elements have same horizontal positions as upper surfaces of said blocking elements.

2. The liquid crystal display module according to claim 1, wherein said liquid crystal display body is mounted inside a space constructed by said base and cover.

3. The liquid crystal display module according to claim 1, wherein upper surfaces of said plurality of protrudent elements are slant flats so as to help said plurality of protrudent elements to protrude through said plurality of mounting openings when said first frame is engaged with said second frame.

4. The liquid crystal display module according to claim 1, wherein bottom surfaces of said plurality of protrudent elements are flat surfaces so as to prevent said first frame from being disengaged from said second frame.

5. The liquid crystal display module according to claim 1, wherein said plurality of mounting openings has sizes larger than those of said plurality of protrudent elements so as to help said engagement between said first frame and said second frame.

6. The liquid crystal display module according to claim 1, wherein said plurality of protrudent elements, said blocking elements, said plurality of mounting openings, and said plurality of indentations are mounted on an outer wall of said liquid crystal display module.

7. The liquid crystal display module according to claim 1, wherein said first frame, said plurality of protrudent elements, and said plurality of blocking elements are formed integrally.

8. The liquid crystal display module according to claim 1, wherein said plurality of protrudent elements and said plurality of blocking elements are positioned on said first frame alternately.

9. The liquid crystal display module according to claim 1, wherein said plurality of protrudent elements have horizontal positions higher than those of said blocking elements.

10. The liquid crystal display module according to claim 1, wherein said liquid crystal display body comprises a backlight module, a liquid crystal assembly, a printed circuit board, and a display panel so as to perform a display function.

11. The liquid crystal display module according to claim 1, wherein said liquid crystal display body is selected from one group consisting of a twisted nematic (TN), a super twisted nematic (STN), a double layer super twisted nematic (DSTN), and a thin film transistor (TFT).

* * * * *